United States Patent
Yang (10) Patent No.: US 8,935,589 B2
(45) Date of Patent: Jan. 13, 2015

(54) CONTROLLER AND DATA ACCESS METHOD FOR FLASH MEMORIES

(75) Inventor: Tsung-Chieh Yang, Jhubei (TW)

(73) Assignee: Silicon Motion, Inc., Jhubei (TW)

( * ) Notice: Subject to any disclaimer, the term of this patent is extended or adjusted under 35 U.S.C. 154(b) by 405 days.

(21) Appl. No.: 12/721,648

(22) Filed: Mar. 11, 2010

(65) Prior Publication Data

US 2010/0306619 A1 Dec. 2, 2010

Related U.S. Application Data (60) Provisional application No. 61/183,163, filed on Jun. 2, 2009.

(30) Foreign Application Priority Data

Aug. 6, 2009 (TW) .............................. 98126499 A (51) Int. Cl.
  *H03M 13/00* (2006.01)
  *G06F 11/10* (2006.01)
  *H03M 13/13* (2006.01)

(52) U.S. Cl.
  CPC .......... *G06F 11/1072* (2013.01); *H03M 13/13* (2013.01)
  USPC ...................................................... 714/758

(58) Field of Classification Search
  CPC .. H03M 13/09; H03M 13/091; H04L 1/0061; H04L 1/0057; H04L 1/0045
  USPC .......... 714/758, E11.054; 711/103, E12.001, 711/E12.008
  See application file for complete search history.

(56) References Cited

U.S. PATENT DOCUMENTS

| 7,269,778 B1 * | 9/2007 | Feng et al. ..................... 714/758 |
| 8,261,159 B1 * | 9/2012 | Sommer et al. ............... 714/768 |
| 2003/0135798 A1 * | 7/2003 | Katayama et al. ............. 714/710 |
| 2004/0057285 A1 * | 3/2004 | Cernea et al. ............ 365/185.12 |

(Continued)

FOREIGN PATENT DOCUMENTS

WO     2007132453 A2    11/2007

OTHER PUBLICATIONS

International Search Report for a corresponding PCT patent application (No. PCT/CN2009/073146) issued on Mar. 25, 2010.

(Continued)

*Primary Examiner* — April Y Blair
*Assistant Examiner* — Thien D Nguyen
(74) *Attorney, Agent, or Firm* — Wang Law Firm, Inc.; Li K. Wang; Stephen Hsu (57) ABSTRACT

The invention provides a controller. In one embodiment, the controller is coupled to a flash memory and a host, and comprises a selective mapper and an error correction code encoder. The selective mapper receives first source data, processes the first source data according to a plurality of pseudo random sequences to obtain a plurality of first mapped data segments, calculates a plurality of cross correlation values between prior data and the first mapped data segments, selects an optimal mapped data segment from the first mapped data segments according to the cross correlation values, and generates output mapped data according to the optimal mapped data segment. The error correction code encoder encodes a first error correction code to be stored in the flash memory according to the output mapped data.

29 Claims, 9 Drawing Sheets

(56) References Cited

U.S. PATENT DOCUMENTS

| | | | |
|---|---|---|---|
| 2004/0205352 A1* | 10/2004 | Ohyama | 713/194 |
| 2005/0270855 A1 | 12/2005 | Earhart | |
| 2007/0208905 A1 | 9/2007 | Litsyn | |
| 2008/0151618 A1* | 6/2008 | Sharon et al. | 365/185.02 |
| 2008/0151621 A1 | 6/2008 | Kong | |
| 2008/0184006 A1 | 7/2008 | Moon | |
| 2008/0187057 A1* | 8/2008 | Qu | 375/260 |
| 2008/0198650 A1 | 8/2008 | Shalvi et al. | |
| 2008/0215893 A1* | 9/2008 | Bliss et al. | 713/189 |
| 2009/0323942 A1* | 12/2009 | Sharon et al. | 380/44 |
| 2010/0070692 A1* | 3/2010 | Litsyn et al. | 711/103 |
| 2010/0131826 A1* | 5/2010 | Shalvi et al. | 714/763 |
| 2011/0093652 A1* | 4/2011 | Sharon et al. | 711/103 |
| 2011/0235410 A1* | 9/2011 | Sharon et al. | 365/185.02 |

OTHER PUBLICATIONS

Office Action of corresponding TW application, issued on May 13, 2013.

* cited by examiner

CONTROLLER AND DATA ACCESS METHOD FOR FLASH MEMORIES

CROSS REFERENCE TO RELATED APPLICATIONS

This application claims the benefit of U.S. Provisional Application No. 61/183,163 filed Jun. 2, 2009, the entirety of which is incorporated by reference herein.

This Application claims priority of Taiwan Patent Application No. 98126499, filed on Aug. 6, 2009, the entirety of which is incorporated by reference herein.

BACKGROUND OF THE INVENTION

1. Field of the Invention

The invention relates to flash memories, and more particularly to controllers of flash memories.

2. Description of the Related Art

A flash memory is a nonvolatile memory which can be electrically erased and programmed. A flash memory is mainly used in a memory card and a universal serial bus device for general data storage. A flash memory comprises a plurality of memory units, each of which is for data storage. A flash memory is divided into two categories comprising a single-level-cell (SLC) flash memory and a multiple-level-cell (MLC) flash memory. A memory cell of an SLC flash memory can only store 1-bit data. A memory cell of an MLC flash memory stores multiple bits of data.

Figure 1A:
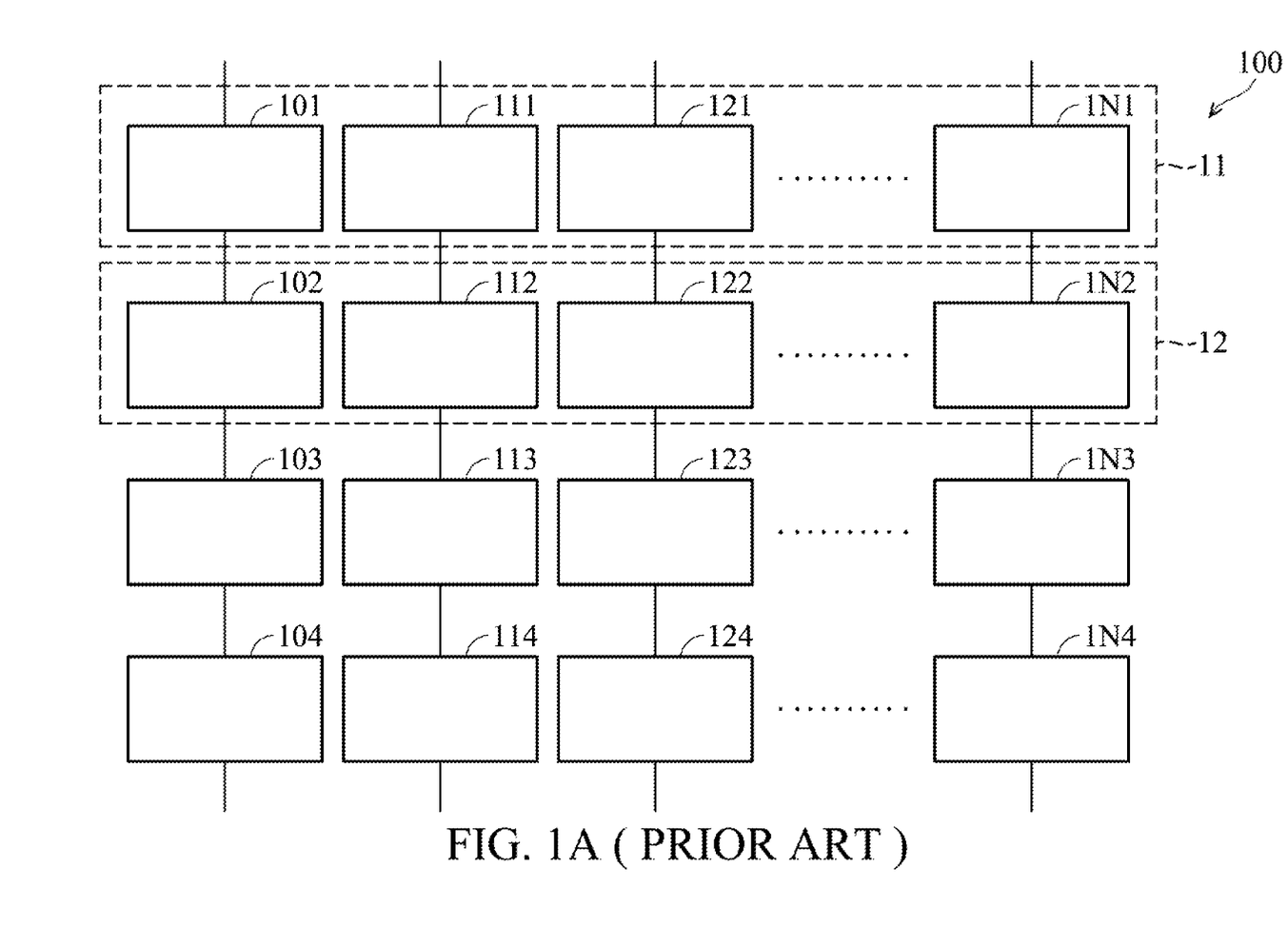
FIG. 1A is a circuit diagram of a portion of an SLC flash memory.

Data is written into a flash memory in a unit of a page. When a controller writes data to a target page of a flash memory, stability of data stored in the neighboring page of the target page is affected by the data content written to the target page. Referring to FIG. 1A, a circuit diagram of a portion of an SLC flash memory 100 is shown. The SLC flash memory 100 comprises a plurality of columns of memory units 101~104, 111~114, 121~124, ..., 1N1~1N4. Each memory unit can only store one-bit data. The controller first stores N-bit data in the first page 11 of the flash memory 100, and then stores N-bit data in the second page 12 of the flash memory 100. The memory cells 101, 111, 121, ..., 1N1 of the first page are respectively neighboring to the memory cells 102, 112, 122, ..., 1N2 of the second page. When the memory cells 101, 111, 121, ..., 1N1 store different bit values from those stored in the memory cells 102, 112, 122, ..., 1N2, because neighboring memory cells have opposite electronic characteristics, data stored in the first page and the second page has high stability. When the memory cells 101, 111, 121, ..., 1N1 store the same bit values as those stored in the memory cells 102, 112, 122, ..., 1N2, because neighboring memory cells have similar electronic characteristics, data stored in the first page and the second page has low stability.

Figure 1B:
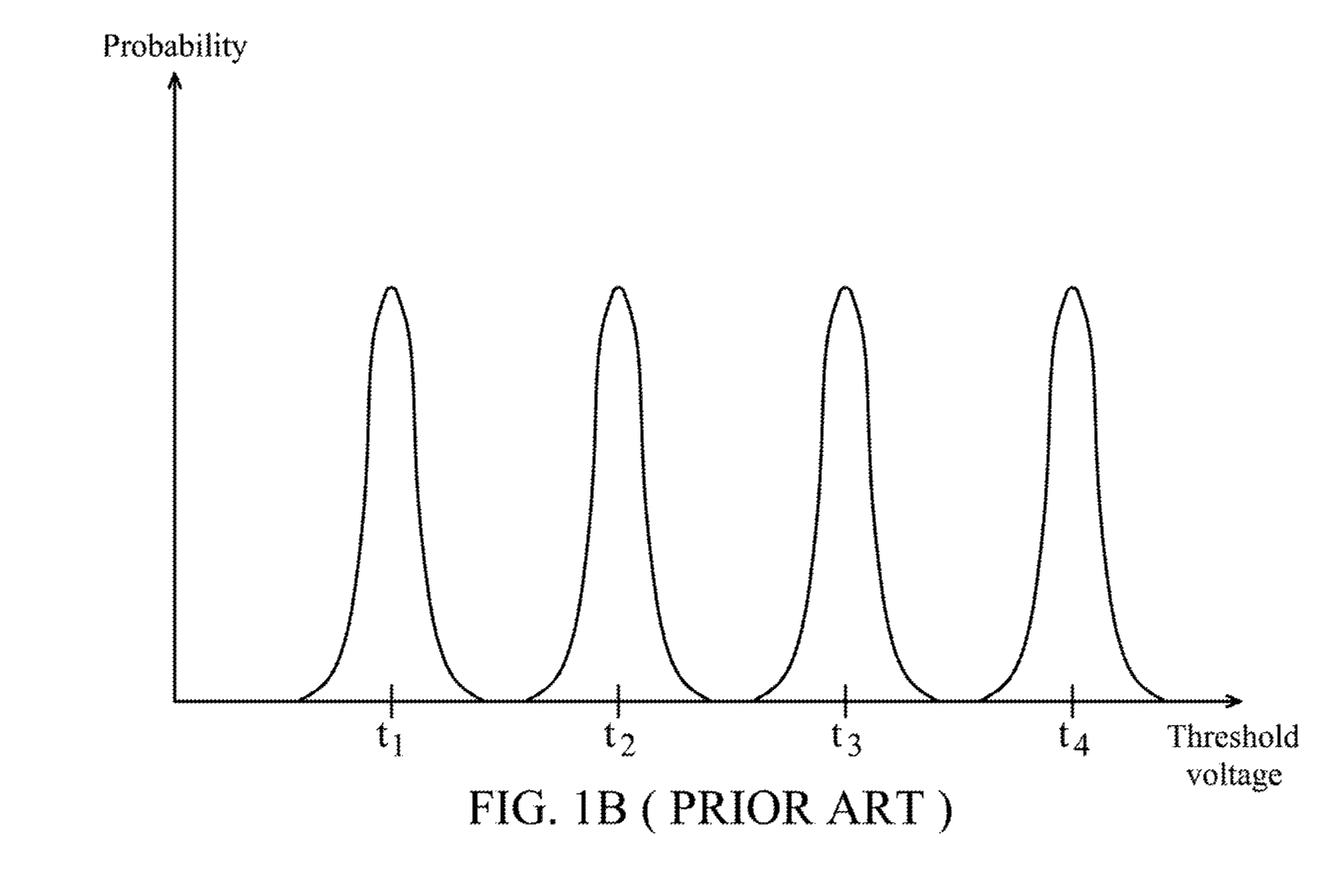
FIG. 1B is a schematic diagram of a probability distribution of threshold voltage of a memory cell of an SLC flash memory.

Referring to FIG. 1B, a schematic diagram of a probability distribution of a threshold voltage of a memory cell of a MLC flash memory is shown. Assume that a memory cell of a MLC flash memory can store two data bits. When the two data bits are (0, 0), the threshold voltage roughly has a level $t_1$, when the two data bits are (0, 1), (1, 0), and (1, 1), the threshold voltage roughly has levels of $t_2$, $t_3$, and $t_4$. When the controller stores data, corresponding data bits of neighboring pages, such as a third bit of a first page and a third bit of a second page, are stored in a memory cell of the MLC flash memory. Referring to FIG. 1B, when corresponding data bits of neighboring pages are (0, 0) or (1, 1), because the threshold voltage of the memory cell has the level $t_1$ or $t_4$, the data bits have high stability. When corresponding data bits of neighboring pages are (0, 1) or (1, 0), because the threshold voltage of the memory cell has the level $t_2$ or $t_3$, the data bits have low stability.

According to the embodiments shown in FIGS. 1A and 1B, flash memories may have different circuit structures to store different bit contents to increase data stability. Thus, a controller of a flash memory is required to dynamically change contents of data to be stored to the flash memory according to circuit structure of the flash memory, thereby increasing data stability of the flash memory.

BRIEF SUMMARY OF THE INVENTION

The invention provides a controller. In one embodiment, the controller is coupled to a flash memory and a host, and comprises a selective mapper and an error correction code encoder. The selective mapper receives first source data, processes the first source data according to a plurality of pseudo random sequences to obtain a plurality of first mapped data segments, calculates a plurality of cross correlation values between prior data and the first mapped data segments, selects an optimal mapped data segment from the first mapped data segments according to the cross correlation values, and generates output mapped data according to the optimal mapped data segment. The error correction code encoder encodes a first error correction code to be stored in the flash memory according to the output mapped data.

The invention also provides a data access method for flash memory. In the first step, first source data is received. The first source data is then processed according to a plurality of pseudo random sequences to obtain a plurality of first mapped data segments. A plurality of cross correlation values between prior data and the first mapped data segments are then calculated. An optimal mapped data segment is then selected from the first mapped data segments according to the cross correlation values. Output mapped data is then generated according to the optimal mapped data segment.

The invention further provides a controller. In one embodiment, the controller is coupled to a flash memory and a host, and comprises an error correction code encoder and a selective mapper. The error correction code encoder receives first source data, and encodes a first error correction code according to the first source data. The selective mapper processes the first error correction code according to a plurality of pseudo random sequences to obtain a plurality of first mapped data segments, calculates a plurality of cross correlation values between prior data and the first mapped data segments, selects an optimal mapped data segment from the first mapped data segments according to the cross correlation values, and generates output mapped data to be stored in the flash memory according to the optimal mapped data segment.

A data access method for flash memory is also provided. First, source data is received. A first error correction code is encoded according to the first source data. The first error correction code is then processed according to a plurality of pseudo random sequences to obtain a plurality of first mapped data segments. A plurality of cross correlation values between prior data and the first mapped data segments are then calculated. An optimal mapped data segment is then selected from the first mapped data segments according to the cross correlation values. Finally, output mapped data to be stored in the flash memory is generated according to the optimal mapped data segment.

A detailed description of the invention is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
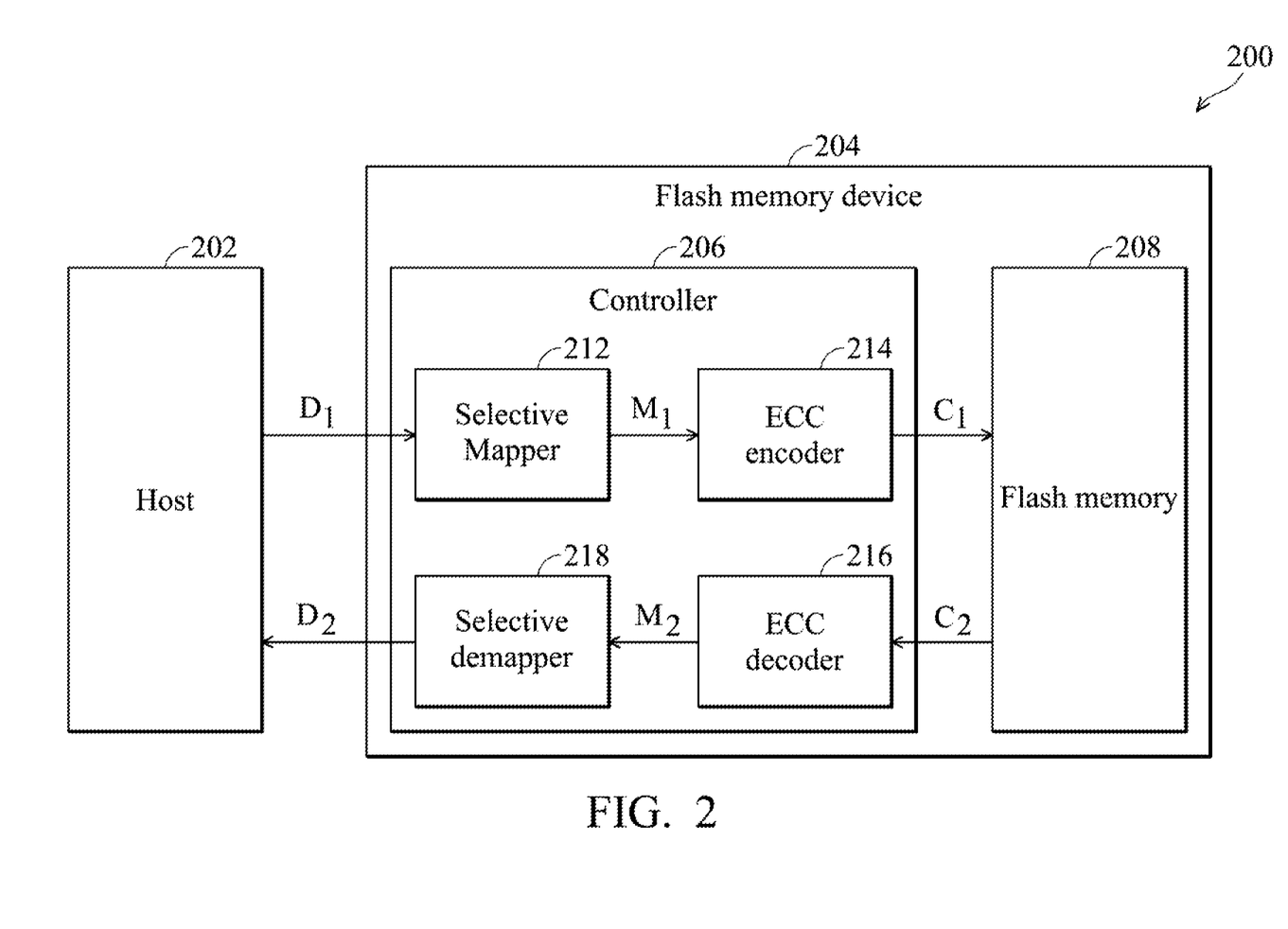
FIG. 2 is a block diagram of an embodiment of a flash memory device according to the invention.

Referring to FIG. 2, a block diagram of a flash memory device 204 according to the invention is shown. The flash memory device 204 is coupled to a host 202, and stores data for the host 202. In one embodiment, the flash memory device 204 comprises a controller 206 and a flash memory 208. The controller 206 manages data access for the flash memory 208. When the host 202 wants to store data to the flash memory device 204, the controller 206 receives data from the host 202, and then writes data to the flash memory 208. When the host 202 wants to retrieve data from the flash memory device 204, the controller 206 directs the flash memory 208 to read data stored therein, and then sends read-out data to the host 202.

In one embodiment, the controller 206 comprises a selective mapper 212, an error correction code (ECC) encoder 214, an error correction code (ECC) decoder 216, and a selective demapper 218. When the host 202 wants to store source data $D_1$ to the flash memory device 204, the controller 206 receives source data $D_1$. First, the selective mapper 212 converts the source data $D_1$ to an output mapped data $M_1$, wherein a cross correlation value between the output mapped data $M_1$ and prior data is not equal to a cross correlation value between the source data $D_1$ and the prior data. The ECC encoder 214 then encodes an error correction code $C_1$ to be stored in the flash memory 208 according to the output mapped data $M_1$. The ECC encoder 214 generates parity according to the output mapped data $M_1$ and then appends the parity to an end of the output mapped data $M_1$ to obtain the error correction code $C_1$. Because the data length of the parity is short in comparison with the total data length of the error correction code $C_1$, the cross correlation value between the prior data and the error correction code $C_1$ is therefore almost equal to the cross correlation value between the prior data and the output mapped data $M_1$.

The controller 206 can therefore dynamically set a cross correlation value between the error correction code $C_1$ and the prior data before the error correction code $C_1$ is stored in the flash memory 208, thus increasing the data stability of the flash memory 208. For example, if the flash memory 208 is a multi-level cell (MLC) flash memory, the controller 208 maximizes the cross correlation value between the error correction code $C_1$ and the prior data to increase the data stability of the flash memory 208. If the flash memory 208 is a single level cell (SLC) flash memory, the controller 208 minimizes the cross correlation value between the error correction code $C_1$ and the prior data to increase the data stability of the flash memory 208. When the host 202 retrieves data from the flash memory 208, the controller 206 first directs the flash memory 208 to read an error correction code $C_2$. The ECC decoder 216 then decodes the error correction code $C_2$ to obtain input mapped data $M_2$. The selective mapper 218 then recovers source data $D_2$ according to the input mapped data $M_2$, and then sends the source data $D_2$ to the host 202 to complete data reading.

Figure 3:
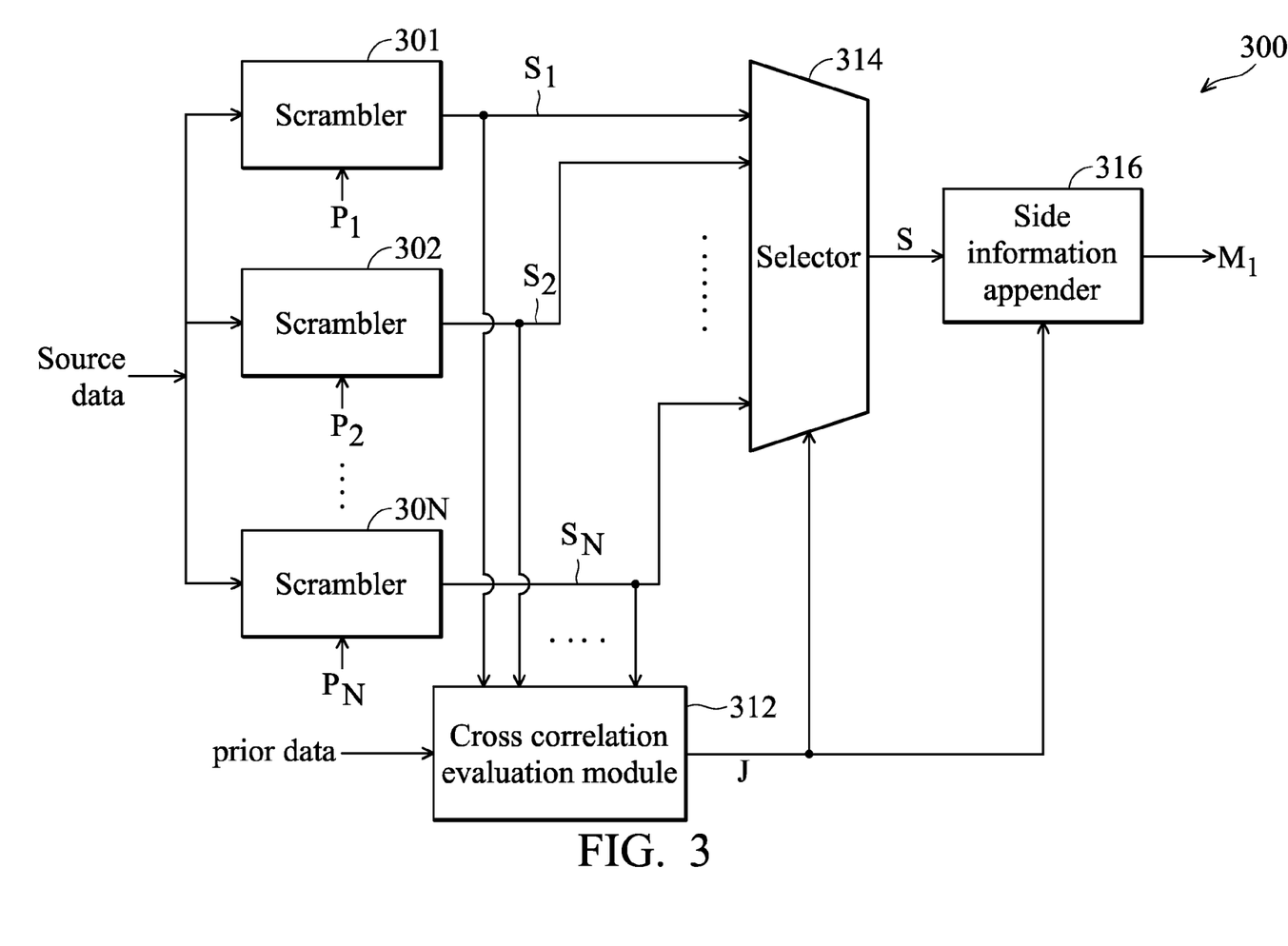
FIG. 3 is a block diagram of an embodiment of a selective mapper according to the invention.
Figure 4:
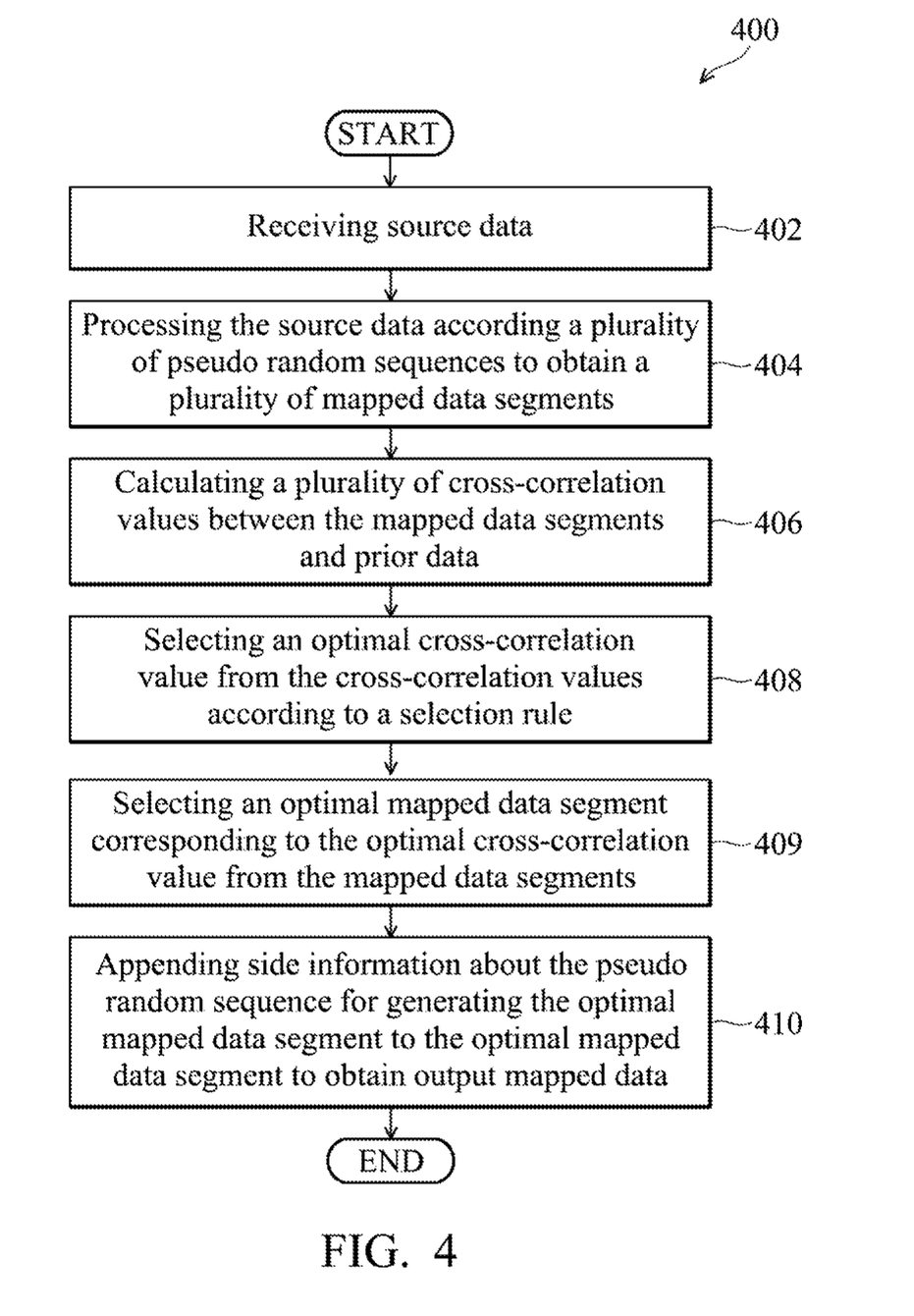
FIG. 4 is a flowchart of a method for converting source data to output mapped data according to the invention.

Referring to FIG. 3, a block diagram of a selective mapper 300 according to the invention is shown. In one embodiment, the selective mapper 300 comprises a plurality of scramblers 301, 302, ..., 30N, a cross correlation evaluation module 312, a selector 314, and a side information appender 316. Referring to FIG. 4, a flowchart of a method 400 for converting source data $D_1$ to output mapped data $M_1$ according to the invention is shown, and the selective mapper 300 operates according to the method 400. First, the selective mapper 300 receives source data $D_1$ (step 402). The scramblers 301, 302, ..., 30N processes the source data $D_1$ according a plurality of pseudo random sequences $P_1, P_2, ..., P_N$ to obtain a plurality of mapped data segments $S_1, S_2, ..., S_N$ (step 404). In one embodiment, the scramblers 301, 302, ..., 30N respectively perform XOR operations on the bits of the source data $D_1$ and the corresponding bits of the pseudo random sequences $P_1, P_2 ..., P_N$ to obtain bits of the mapped data segments $S_1, S_2, ..., S_N$.

The cross correlation evaluation module 312 then calculates a plurality of cross correlation values between the mapped data segments $S_1, S_2, ..., S_N$ and prior data (step 406). In one embodiment, the cross correlation evaluation module 312 performs XOR operations on the bits of the mapped data segments $S_1, S_2, ..., S_N$ and the corresponding bits of the prior data to obtain a plurality of XOR values, and then sums XOR values to generate the cross correlation values. In one embodiment, the cross correlation evaluation module 312 performs an XOR operation on a first bit of the mapped data segment $S_1$ and a first bit of the prior data to generate a first XOR value. It then performs an XOR operation on a second bit of the mapped data segment $S_1$ and a second bit of the prior data to generate a second XOR value, accordingly performs an XOR operation on a last bit of the mapped data segment $S_1$ and a last bit of the prior data to generate a last XOR value, and then sums the first XOR value, the second XOR value, ..., and the last XOR value to obtain a cross correlation value of the mapped data segment $S_1$. The cross correlation values of the mapped data segments $S_2, ..., S_N$ are generated in a way similar to that corresponding to the mapped data segment $S_1$.

The cross correlation evaluation module 312 then selects an optimal cross correlation value J from the cross-correlation values according to a selection rule (step 408). In one embodiment, the flash memory 208 is a multi-level cell flash memory, bits of the optimal mapped data segment S selected by the selector 314 are stored in the same memory cells of the flash memory 208, and the cross correlation evaluation module 312 selects a maximum cross correlation value from the cross correlation values as the optimal cross correlation value J, thus increasing the data stability of the flash memory 208. In another embodiment, the flash memory 208 is a single level cell flash memory, bits of the optimal mapped data segment S selected by the selector 314 are stored memory cells neighboring to each other, and the cross correlation evaluation module 312 selects a minimum cross correlation value from the cross correlation values as the optimal cross correlation value J, thus increasing the data stability of the flash memory 208. The selector 314 then selects an optimal mapped data segment S corresponding to the optimal cross-correlation value J from the mapped data segments $S_1, S_2, \ldots, S_N$ (step 409). Finally, the side information appender 316 appends side information about the pseudo random sequence for generating the optimal mapped data segment S to the optimal mapped data segment S to obtain output mapped data $M_1$ (step 410).

Figure 5:
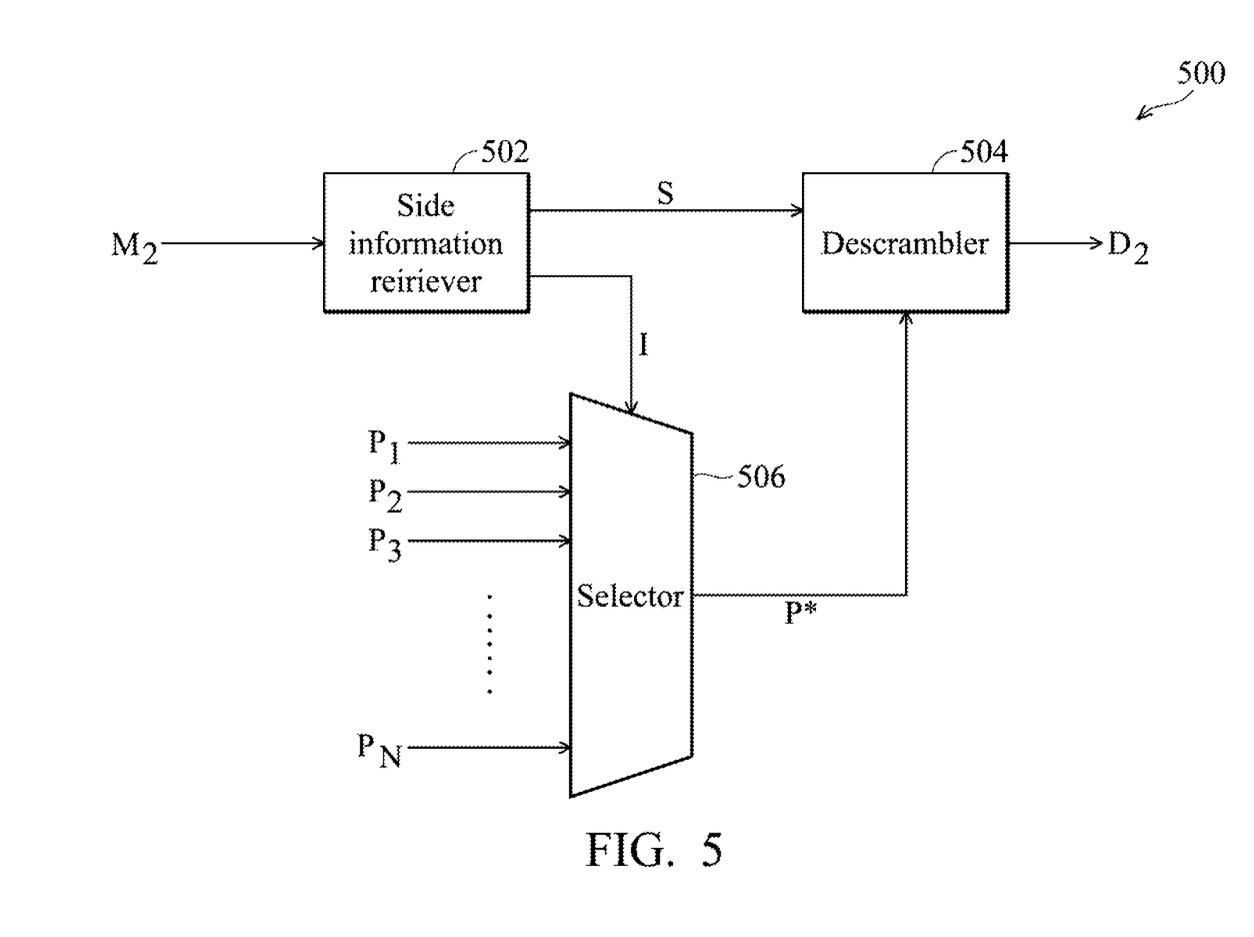
FIG. 5 is a block diagram of an embodiment of a selective demapper according to the invention.
Figure 6:
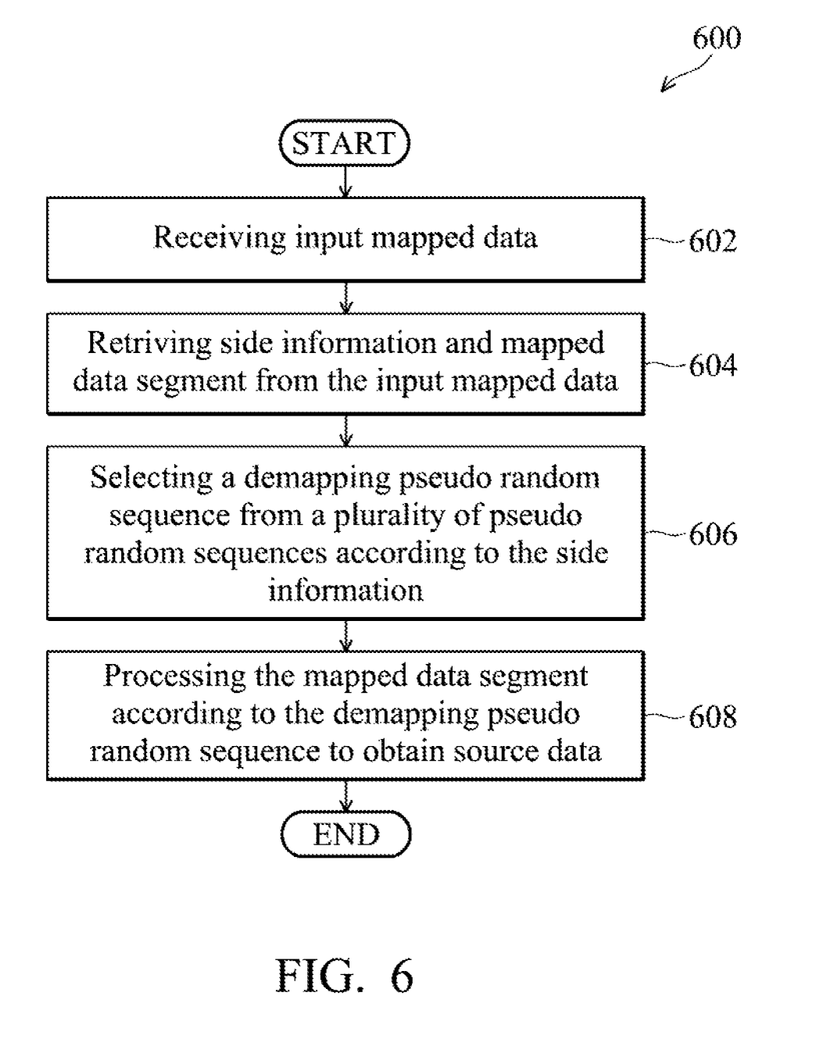
FIG. 6 is a flowchart of a method for recovering source data according to input mapped data according to the invention.

Referring to FIG. 5, a block diagram of a selective demapper 500 according to the invention is shown. In one embodiment, the selective demapper 500 comprises a side information receiver 502, a selector 506, and a descrambler 504. Referring to FIG. 6, a flowchart of a method 600 for recovering source data $D_2$ according to input mapped data $M_2$ according to the invention is shown, and the selective demapper 500 operates according to the method 500. First, the selective demapper 500 receives input mapped data $M_2$ (step 602). The side information retriever 502 then retrieves side information I, and mapped data segment S from the input mapped data $M_2$ (step 604). The selector 506 then selects a demapping pseudo random sequence P* from a plurality of pseudo random sequences $P_1, P_2, \ldots, P_N$ according to the side information I, wherein the demapping pseudo random sequence P* is the pseudo random sequence for generating the input mapped data S (step 606). The descrambler 504 then processes the mapped data segment S according to the demapping pseudo random sequence P* to obtain source data $D_2$ (step 608). Finally, the controller sends the source data to a host to complete data reading.

Figure 7:
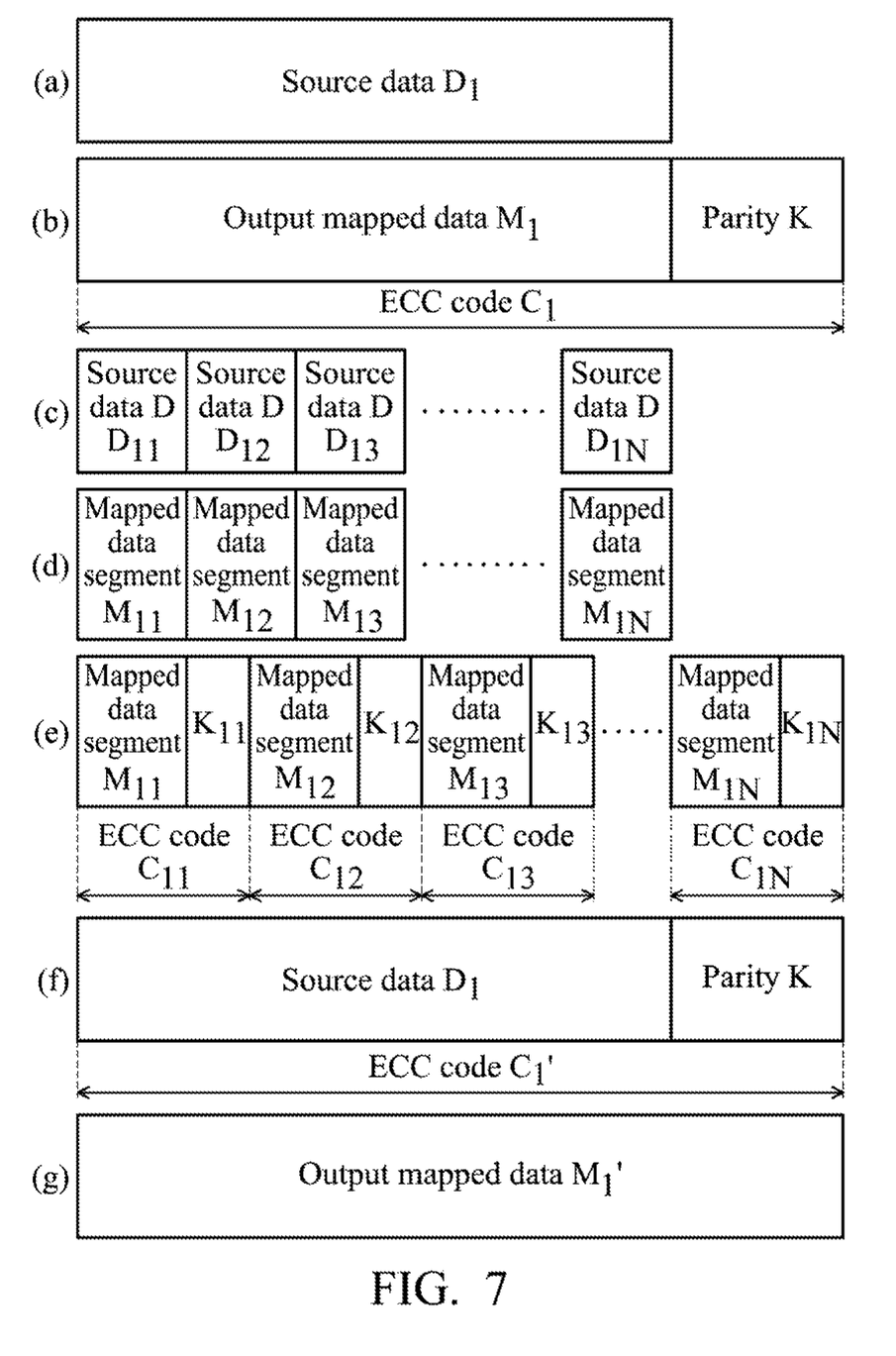
FIG. 7 is a schematic diagram of signals in a process for generating data to be written to the flash memory according to the invention.

Referring to FIG. 7, a schematic diagram of signals in a process for generating data to be written to the flash memory 208 according to the invention is shown. As shown in FIG. 7(a), a controller 206 receives a source data $D_1$. The selective mapper 212 then converts the source data $D_1$ to the mapped data $M_1$ comprising side information shown in FIG. 7(b). The ECC encoder 214 then generates a parity K according to the mapped data $M_1$, and appends the parity K to an end of the mapped data $M_1$ to obtain an error correction code $C_1$ shown in FIG. 7(b). Generally, data lengths of the source data $D_1$ and the mapped data $M_1$ may be equal to data sector size of the host 202 or page size of the flash memory 208. The selective mapper 300, however, is required to comprise a plurality of registers for respectively storing the plurality of mapped data segments $S_1, S_2, \ldots, S_N$. When data size of the mapped data segments $S_1, S_2, \ldots, S_N$ are large, the manufacture cost of registers of the selective mapper 300 is increased.

In another embodiment, after the controller 206 receives the source data $D_1$, the controller 206 divides the source data $D_1$ into a plurality of source data segments $D_{11}, D_{12}, D_{13}, \ldots, D_{1N}$ shown in FIG. 7(c), and then sequentially delivers the segments to the selective mapper 300 to sequentially generate a plurality of mapped data segments $M_{11}, M_{12}, M_{13}, \ldots, M_{1N}$ shown in FIG. 7(d). The ECC encoder 214 then encodes the error correction codes $C_{11}, C_{12}, C_{13}, \ldots, C_{1N}$ shown in FIG. 7(e) according to the mapped data segments $M_{11}, M_{12}, M_{13}, \ldots, M_{1N}$ shown in FIG. 7(d). Because the data length of the source data segments $D_{11}, D_{12}, D_{13}, \ldots, D_{1N}$ is less than the data length of the source data $D_1$, the capacity of the registers of the selective mapper 300 is therefore reduced, thus reducing the manufacture cost of the registers of the selective demapper 300.

Figure 8:
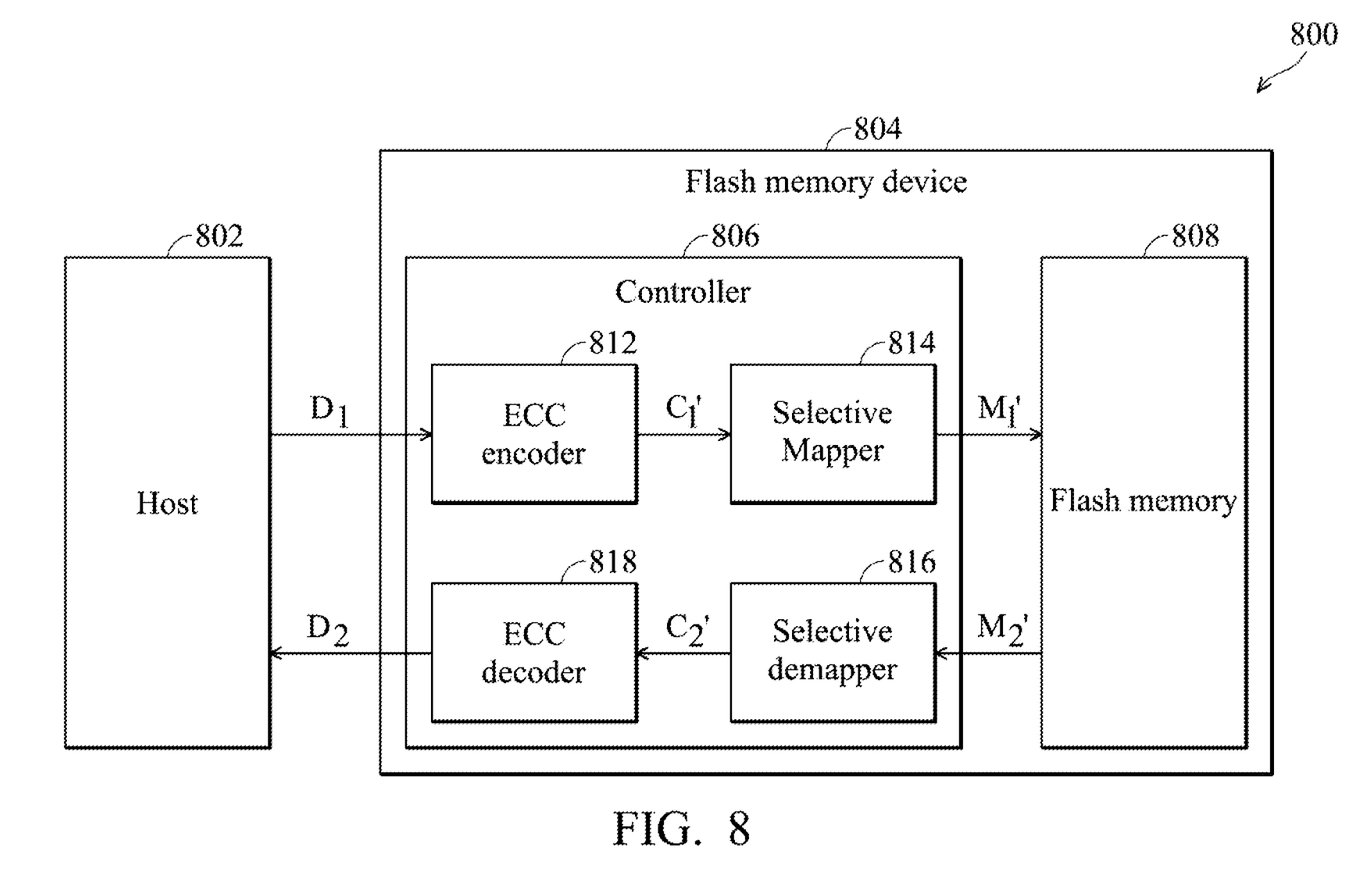
FIG. 8 is a block diagram of another embodiment of a flash memory device according to the invention.

In FIG. 2, the ECC encoder 214 is coupled to an end of the selective mapper 212. In another embodiment, a selective mapper can coupled to an end of an ECC encoder. Referring to FIG. 8, a block diagram of another embodiment of a flash memory device 804 according to the invention is shown. The flash memory device 804 comprises a controller 806 and a flash memory 808. In one embodiment, the controller 806 comprises an ECC encoder 812, a selective mapper 814, a selective demapper 816, and an ECC decoder 818. When the controller 806 receives source data $D_1$ from the host 802, the ECC encoder 812 encodes an error correction code $C_1'$ according to the source data $D_1$. The selective mapper 814 then converts the error correction code $C_1'$ to output mapped data $M_1'$ to be stored in the flash memory 808. The selective mapper 814 has a similar circuit structure as that of the selective mapper 300 shown in FIG. 3.

Referring to FIG. 7(f), the ECC encoder 812 encodes an error correction code $C_1'$ comprising a parity K according to the source data $D_1$. The selective mapper 814 then converts the error correction code $C_1'$ to the mapped data $M_1'$ shown in FIG. 7(g). In comparison with the controller 206 shown in FIG. 2, the controller 806 shown in FIG. 8 therefore can adjust the cross correlation value of the entire error correction code $C_1'$ comprising the parity to increase data stability. When the host 802 wants to read data from the flash memory device 804, the controller 806 directs the flash memory 808 to read input mapped data $M^{2\prime}$. The selective demapper 816 then converts the input mapped data $M^{2\prime}$ to an error correction code $C^{2\prime}$. The selective demapper 816 has a circuit structure similar to that of the selective damapper 500 shown in FIG. 5. Finally, the ECC decoder 818 decodes the error correction code $C^{2\prime}$ to obtain source data D2. The controller 806 then sends the source data $D^2$ to the host 802 to complete data reading.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A controller, coupled to a flash memory, comprising:
    a selective mapper, receiving prior data and first source data, scrambling the first source data-using a plurality of pseudo random sequences to obtain a plurality of first mapped data segments, calculating a plurality of cross correlation values between prior data and the first mapped data segments, selecting an optimal mapped data segment from the first mapped data segments according to the cross correlation values, and generating output mapped data according to the optimal mapped data segment and a type of the flash memory, wherein the first mapped data segments are not read from the flash memory and are generated by the selective mapper; and
    an error correction code encoder, encoding a first error correction code to be stored in the flash memory according to the output mapped data, wherein the bits of the prior data are stored in the same memory cell or the neighboring cell as those storing bits of the first error correction code.

2. The controller as claimed in claim 1, wherein the selective mapper generates first side information for identifying the pseudo random sequence generating the optimal mapped data segment, and appending the first side information to the optimal mapped data segment to obtain the output mapped data.

3. The controller as claimed in claim 1, wherein the selective mapper comprises:
a plurality of scramblers, scrambling the first source data using each of the pseudo random sequences to obtain the first mapped data segments;
a cross correlation evaluation module, calculating the cross correlation values between the first mapped data segments and the prior data, and selecting an optimal cross correlation value from the cross correlation values according a selection rule; and
a selector, selecting the first mapped data segment corresponding to the optimal cross correlation value as the optimal mapped data segment.

4. The controller as claimed in claim 3, wherein the selective mapper further comprises:
a side information appender, generating first side information corresponding to the optimal cross correlation value, and appending the first side information to the optimal mapped data segment to obtain the output mapped data.

5. The controller as claimed in claim 3, wherein the scramblers perform XOR operations on bits of the first source data and bits of the pseudo random sequences to obtain the first mapped data segments.

6. The controller as claimed in claim 3, wherein the flash memory is a multi-level cell (MLC) flash memory, bits of the first error correction code are stored in the same memory cells as those storing bits of the prior data, and the cross correlation evaluation module selects a maximum cross correlation value from the cross correlation values as the optimal cross correlation value.

7. The controller as claimed in claim 3, wherein the flash memory is a single level cell (SLC) flash memory, bits of the first error correction code are stored in first memory cells neighboring to second memory cells storing bits of the prior data, and the cross correlation evaluation module selects a minimum cross correlation value from the cross correlation values as the optimal cross correlation value.

8. The controller as claimed in claim 2, wherein the controller further comprises:
an error correction code decoder, receiving a second error correction code from the flash memory, and decoding the second error correction code to obtain input mapped data; and
a selective demapper, retrieving second side information and a second mapped data segment from the input mapped data, selecting a demapping pseudo random sequence from the pseudo random sequences according to the second side information, and processing the second mapped data segment according to the demapping pseudo random sequence to obtain second source data to be transmitted to the host.

9. The controller as claimed in claim 8, wherein the selective demapper comprises:
a side information retriever, retrieving the second side information and the second mapped data segment from the input mapped data;
a selector, selecting the demapping pseudo random sequence from the pseudo random sequences according to the second side information; and
a descrambler, processing the second mapped data segment according to the demapping pseudo random sequence to obtain the second source data.

10. The controller as claimed in claim 9, wherein the descrambler performs XOR operations on bits of the second mapped data segment and bits of the demapping pseudo random sequence to generate the second source data.

11. A data access method for a flash memory, comprising:
receiving prior data and first source data;
scrambling the first source data using a plurality of pseudo random sequences to obtain a plurality of first mapped data segments by a selective mapper, wherein the first mapped data segments are not read from the flash memory and are generated by the selective mapper;
calculating a plurality of cross correlation values between prior data and the first mapped data segments;
selecting an optimal mapped data segment from the first mapped data segments according to the cross correlation values and a type of the flash memory;
generating output mapped data according to the optimal mapped data segment; and
encoding a first error correction code to be stored in the flash memory according to the output mapped data, wherein bits of the prior data are stored in the same memory cell or the neighboring cell as those storing bits of the first error correction code.

12. The data access method as claimed in claim 11, wherein generating of the output mapped data comprises:
generating first side information for identifying the pseudo random sequence generating the optimal mapped data segment; and
appending the first side information to the optimal mapped data segment to obtain the output mapped data.

13. The data access method as claimed in claim 11, wherein scrambling of the first source data comprises:
performing XOR operations on bits of the first source data and bits of the pseudo random sequences to obtain the first mapped data segments.

14. The data access method as claimed in claim 11, wherein the flash memory is a multi-level cell (MLC) flash memory, bits of the first error correction code are stored in the same memory cells as those storing bits of the prior data, and selecting of the optimal mapped data segment comprises:
determining a maximum cross correlation value from the cross correlation values; and
selecting the first mapped data segment corresponding to the maximum cross correlation value as the optimal mapped data segment.

15. The data access method as stated in claim 11, wherein the flash memory is a single level cell (SLC) flash memory, bits of the first error correction code are stored first memory cells neighboring to second memory cells storing bits of the prior data, and electing of the optimal mapped data segment comprises:
determining a minimum cross correlation value from the cross correlation values; and
selecting the first mapped data segment corresponding to the minimum cross correlation value as the optimal mapped data segment.

16. The data access method as claimed in claim 12, wherein the data access method further comprises:
receiving input mapped data;
retrieving second side information and a second mapped data segment from the input mapped data;
selecting a demapping pseudo random sequence from the pseudo random sequences according to the second side information; and
processing the second mapped data segment according to the demapping pseudo random sequence to obtain second source data to be transmitted to a host.

17. The data access method as claimed in claim 16, wherein the data access method further comprises:
   receiving a second error correction code from the flash memory; and
   decoding the second error correction code to obtain the input mapped data.

18. The data access method as claimed in claim 16, wherein processing of the second mapped data segment comprises:
   performing XOR operations on bits of the second mapped data segment and bits of the demapping pseudo random sequence to generate the second source data.

19. A controller, coupled to a flash memory, comprising:
   an error correction code encoder, receiving prior data and first source data, and encoding a first error correction code according to the first source data; and
   a selective mapper, scrambling the first error correction code using a plurality of pseudo random sequences to obtain a plurality of first mapped data segments, calculating a plurality of cross correlation values between prior data and the first mapped data segments, selecting an optimal mapped data segment from the first mapped data segments according to the cross correlation values and a type of the flash memory, and generating output mapped data to be stored in the flash memory according to the optimal mapped data segment, wherein the first mapped data segments are not read from the flash memory and are generated by the selective mapper, and bits of the prior data are stored in the same memory cell or the neighboring cell as those storing bits of the first error correction code.

20. The controller as claimed in claim 19, wherein the selective mapper generates first side information for identifying the pseudo random sequence generating the optimal mapped data segment, and appending the first side information to the optimal mapped data segment to obtain the output mapped data.

21. The controller as claimed in claim 20, wherein the selective mapper comprises:
   a plurality of scramblers, scrambling the first error correction code using each of pseudo random sequences to obtain the first mapped data segments;
   a cross correlation evaluation module, calculating the cross correlation values between the first mapped data segments and the prior data, and selecting an optimal cross correlation value from the cross correlation values according to a selection rule;
   a selector, selecting the first mapped data segment corresponding to the optimal cross correlation value as the optimal mapped data segment; and
   a side information appender, generating first side information corresponding to the optimal cross correlation value, and appending the first side information to the optimal mapped data segment to obtain the output mapped data.

22. The controller as claimed in claim 21, wherein the scramblers perform XOR operations on bits of the first error correction code and bits of the pseudo random sequences to obtain the first mapped data segments.

23. The controller as claimed in claim 19, wherein the controller further comprises:
   a selective demapper, receiving input mapped data from the flash memory, retrieving second side information and a second mapped data segment from the input mapped data, selecting a demapping pseudo random sequence from the pseudo random sequences according to the second side information, and processing the second mapped data segment according to the demapping pseudo random sequence to obtain second error correction code; and
   an error correction code decoder, decoding the second error correction code to obtain second source data to be transmitted to a host.

24. The controller as claimed in claim 23, wherein the selective demapper comprises:
   a side information retriever, retrieving the second side information and the second mapped data segment from the input mapped data;
   a selector, selecting the demapping pseudo random sequence from the pseudo random sequences according to the second side information; and
   a descrambler, processing the second mapped data segment according to the demapping pseudo random sequence to obtain the second error correction code.

25. The controller as claimed in claim 24, wherein the descrambler performs XOR operations on bits of the second mapped data segment and bits of the demapping pseudo random sequence to generate the second error correction code.

26. The controller as claimed in claim 21, wherein the flash memory is a multi-level cell (MLC) flash memory, bits of the output mapped data are stored in the same memory cells as those storing bits of the prior data, and the cross correlation evaluation module selects a maximum cross correlation value from the cross correlation values as the optimal cross correlation value.

27. The controller as claimed in claim 21, wherein the flash memory is a single level cell (SLC) flash memory, bits of the first output mapped data are stored in first memory cells neighboring to second memory cells storing bits of the prior data, and the cross correlation evaluation module selects a minimum cross correlation value from the cross correlation values as the optimal cross correlation value.

28. A data access method for a flash memory, comprising:
   receiving prior data and first source data;
   encoding a first error correction code according to the first source data;
   scrambling the first error correction code using a plurality of pseudo random sequences to obtain a plurality of first mapped data segments by a selective mapper, respectively, wherein the first mapped data segments are not read from the flash memory and are generated by the selective mapper;
   calculating a plurality of cross correlation values between prior data and the first mapped data segments;
   selecting an optimal mapped data segment from the first mapped data segments according to the cross correlation values and a type of the flash memory;
   generating output mapped data to be stored in the flash memory according to the optimal mapped data segment; and
   encoding a first error correction code to be stored in the flash memory according to the output mapped data, wherein bits of the prior data are stored in the same memory cell or the neighboring cell as those storing bits of the first error correction code.

29. The controller as claimed in claim 1, wherein the selective mapper further performs XOR operations on the bits of each of the plurality of first mapped data segments and the corresponding bits of the prior data to obtain a plurality of XOR values, and sums the plurality XOR values to obtain the plurality of cross correlation values.

* * * * *